US011774935B2

(12) United States Patent
Wang et al.

(10) Patent No.: US 11,774,935 B2
(45) Date of Patent: Oct. 3, 2023

(54) APPARATUS, CONTROL METHOD AND CONTROL DEVICE OF SEMICONDUCTOR PACKAGING

(71) Applicant: CAPCON LIMITED, Hong Kong (CN)

(72) Inventors: Hong Gang Wang, Singapore (SG); Feng Yu, Singapore (SG); Yang Li, Singapore (SG); Min Wang, Singapore (SG)

(73) Assignee: Capcon Limited, Hong Kong (CN)

( * ) Notice: Subject to any disclaimer, the term of this patent is extended or adjusted under 35 U.S.C. 154(b) by 1055 days.

(21) Appl. No.: 16/338,546

(22) PCT Filed: Oct. 8, 2016

(86) PCT No.: PCT/CN2016/101500
§ 371 (c)(1),
(2) Date: Apr. 1, 2019

(87) PCT Pub. No.: WO2018/064813
PCT Pub. Date: Apr. 12, 2018

(65) Prior Publication Data
US 2020/0241498 A1    Jul. 30, 2020

(51) Int. Cl.
G05B 19/19  (2006.01)
H02P 21/22  (2016.01)
H01L 23/00  (2006.01)

(52) U.S. Cl.
CPC .............. *G05B 19/19* (2013.01); *H01L 24/75* (2013.01); *H02P 21/22* (2016.02);
(Continued)

(58) Field of Classification Search
CPC .................. G05B 19/19; H01L 24/741; H01L 2224/75821; H01L 2224/75901; H01L 2224/7592; H01L 24/75; H02P 21/22
See application file for complete search history.

(56) References Cited

U.S. PATENT DOCUMENTS 4,913,763 A * 4/1990 Yamazaki ........... B29C 66/8227
                                            156/497
5,060,841 A * 10/1991 Oshima .................. H01L 24/85
                                            228/180.5
(Continued)

FOREIGN PATENT DOCUMENTS

CN    201054346 Y    4/2008
CN    201601115 U    10/2010
(Continued)

OTHER PUBLICATIONS

International Search Report and Written Opinion for corresponding International Application No. PCT/CN2016/101500 dated Jul. 19, 2017 with English translation of International Search Report.

*Primary Examiner* — Jennifer L Norton
(74) *Attorney, Agent, or Firm* — Renner, Otto, Boisselle & Sklar

(57) ABSTRACT

In one aspect of the invention, a semiconductor packaging apparatus is provided and comprises: a bonding device for bonding a component to a substrate; a motor for driving the bonding device to operate according to a predetermined motion trajectory; a position sensor for detecting a position of the bonding device at a specific time point and generating a position signal; a motion control unit comprising a path planner for generating a position-time command for the bonding device according to a bonding process requirement, the motion control unit being configured to enable the path planner to update the position-time command based on a touch information between the component and the substrate. In a further aspect of the invention, a control algorithm for the semiconductor packaging apparatus to identify and generate the touch information is also provided, and the process control flow is optimized using the touch information.

8 Claims, 6 Drawing Sheets

(52) U.S. Cl.
CPC ............ *G05B 2219/45031* (2013.01); *H01L 2224/7592* (2013.01); *H01L 2224/75821* (2013.01); *H01L 2224/75901* (2013.01)

(56) References Cited

U.S. PATENT DOCUMENTS

| | | | | |
|---|---|---|---|---|
| 5,742,602 | A * | 4/1998 | Bennett | H04L 9/40 370/465 |
| 8,460,491 | B1 * | 6/2013 | Fukasawa | H01L 21/67144 156/367 |
| 9,332,494 | B1 * | 5/2016 | Yuan | H04W 52/0216 |
| 2005/0061852 | A1 * | 3/2005 | Behler | H01L 24/75 228/102 |
| 2005/0269713 | A1 * | 12/2005 | Oh | H01L 24/85 257/E23.179 |
| 2006/0060631 | A1 * | 3/2006 | Frasch | H02K 41/0356 228/4.5 |
| 2006/0118602 | A1 * | 6/2006 | Urben | H01L 24/83 228/262.1 |
| 2008/0004823 | A1 * | 1/2008 | Matsushita | G05B 19/41875 702/82 |
| 2012/0117796 | A1 * | 5/2012 | Kim | H01L 24/81 29/832 |
| 2014/0175159 | A1 * | 6/2014 | Kostner | H01L 24/81 228/103 |
| 2014/0224405 | A1 | 8/2014 | Kinouchi et al. | |
| 2015/0057766 | A1 * | 2/2015 | Ejiri | G05B 15/02 700/12 |
| 2015/0200957 | A1 * | 7/2015 | Zhang | G08G 1/163 726/22 |
| 2016/0174426 | A1 * | 6/2016 | Kurata | H05K 13/084 29/739 |
| 2017/0277615 | A1 * | 9/2017 | Hitchcock | G06F 11/3065 |
| 2019/0080942 | A1 | 3/2019 | Yu et al. | |
| 2019/0088615 | A1 | 3/2019 | Yu et al. | |

FOREIGN PATENT DOCUMENTS

| | | | | |
|---|---|---|---|---|
| EP | 1189497 | A2 * | 3/2002 | ............ H05K 13/08 |
| EP | 1592292 | A1 * | 11/2005 | ......... H05K 13/0417 |
| JP | 2765833 | B2 * | 6/1998 | |
| JP | 3452046 | B2 * | 12/2000 | |
| JP | 2002368021 | A * | 12/2002 | |
| JP | 2004103653 | A * | 4/2004 | ............ H01L 24/75 |
| WO | WO-2004112100 | A1 * | 12/2004 | ....... H01L 21/67144 |
| WO | 2017124424 | | 7/2017 | |
| WO | 2017156671 | | 9/2017 | |

\* cited by examiner

APPARATUS, CONTROL METHOD AND CONTROL DEVICE OF SEMICONDUCTOR PACKAGING

This application is a national phase of International Application No. PCT/CN2016/101500 filed Oct. 8, 2016.

FIELD OF THE INVENTION

The present invention relates to a field of semiconductor manufacturing technology, particularly to an automated control of semiconductor manufacturing and assembly.

BACKGROUND OF THE INVENTION

In the manufacture process of semiconductor components, especially in the assembly and packaging process of semiconductor components, it is often necessary to move semiconductor components from one location to another, such as transferring and bonding a die from a wafer to a substrate. In order to complete the transfer, it is generally necessary to arrange a motor on a transfer device for transferring the semiconductor components, the motor being capable of driving the transfer device to move according to a predetermined trajectory. Meanwhile, in prior arts, it is usually necessary to install a precise touch sensor on a transfer device to detect a touch event between a semiconductor component and other devices or a substrate during the transfer. A motion control unit can automatically update the trajectory settings of the transfer device according to the touch event obtained by the touch sensor, to achieve precise control of the component assembly and manufacture.

However, for a semiconductor manufacturing apparatus with multiple transfer devices (such as a multi-head bonding device), if each of the transfer devices is provided with a touch sensor, the entire semiconductor manufacturing apparatus becomes abnormally complicated and expensive. Nowadays, semiconductor manufacturing apparatus are pursuing compact modularity, which may not have enough space to install touch sensors. These problems, as well as many other problems caused by touch sensors, make it impossible to accurately control and operate a semiconductor manufacturing apparatus with multiple transfer devices.

SUMMARY OF THE INVENTION

At least one object of the present invention is to provide a semiconductor packaging apparatus for the above problems existing in the prior arts.

In one aspect of the invention, a semiconductor packaging apparatus is provided, the semiconductor packaging apparatus comprising: a bonding device for bonding a component to a substrate; a motor for driving the bonding device to operate according to a predetermined motion trajectory; a position sensor for detecting a position of the bonding device at a specific time point and generating a position signal; a motion control unit comprising a path planner for generating a position-time command for the bonding device, the motion control unit being configured to enable the path planner to update the position-time command based on the touch information between the component and the substrate.

Preferably, the motion control unit is further configured to: obtain the position signal generated by the position sensor at a specific time point; compare the position signal with a position-time command generated by the path planner; produce a corresponding rectifying command relating to force or torque to control the motion of the motor according to a result of the comparison.

Preferably, the semiconductor packaging apparatus further comprises a motor driver, the motor driver being configured to: obtain a rectifying command; obtain a present phase current of the motor and generate a corresponding feedback signal; compare the rectifying command with the feedback signal, and adjust the outputted phase current to the motor according to a result of the comparison.

Preferably, the touch information comprises: a time point when the component touches the substrate; and/or a position where the component touches the substrate; and/or a speed of the component before touching the substrate.

Preferably, the update of the position-time command makes the bonding device to move at a preset speed for a preset time period before and after the component and the substrate being touched.

Preferably, the updated position-time command enables the component to reach a preset pressing force in a shorter time and continue to maintain a preset pressing time after the touch information occurs.

Preferably, the semiconductor packaging apparatus further comprises a touch detecting unit for detecting the touch information, the touch detecting unit being configured to: obtain a plurality of rectifying commands within the most recent sample period from the motion control unit; determine a mean value of the plurality of rectifying commands during the most recent sample period; obtain the latest rectifying command after the most recent sample period; calculate a difference between the mean value and the latest rectifying command; determine whether there is a touch between the component and the substrate according to the difference.

Preferably, if the difference is greater than a predetermined threshold, it is determined that the touch occurs.

Preferably, if signs for a preset of successive said difference values remain unchanged, then it is determined that the touch occurs.

In another aspect, a method of controlling a semiconductor packaging apparatus is provided, the semiconductor packaging apparatus comprising a bonding device for bonding a component to a substrate, a motor for driving the bonding device, and a motion control unit for controlling the motor, the method comprising: receiving a plurality of rectifying commands relating to force or torque within the most recent sample period from the motion control unit; determining a mean value of the plurality of the rectifying commands; obtaining the latest rectifying command after the most recent sample period; determining a difference between the mean value and the latest rectifying command; determining whether there is a touch between the component and the substrate according to the difference; updating the position-time command, stored in the motion control unit, relating to the predetermined motion trajectory of the bonding device, when the touch occurs.

Preferably, if the difference is greater than a predetermined threshold, it is determined that the touch occurs.

Preferably, if signs for a preset of successive said difference values remain unchanged, then it is determined that the touch occurs.

Preferably, before the touch between the component and the substrate occurs, the bonding device moves at a preset constant speed and the motion control unit notifies a touch detection unit to start touch detection.

Preferably, the position-time command updated after the occurrence of the touch information enables the component to reach a preset pressing force in a shorter time and continuously maintain the preset pressing time.

Preferably, the method further comprises: obtaining an actual position of the bonding device at a specific time point through a position sensor and generating a position signal; comparing the position signal with a position-time command generated by a path planner in the motion control unit; controlling the motion of the motor based on the corresponding rectifying command produced from the comparison result.

Preferably, the method further comprises: obtaining the latest rectifying command of the motion control unit; obtaining the latest phase current of the motor and generating a corresponding feedback signal; comparing the latest rectifying command with the feedback signal; adjusting the actual outputted phase current to the motor according to a comparison result.

In another aspect, a control device for semiconductor packaging apparatus is provided, wherein the semiconductor packaging apparatus comprises a bonding device for bonding a component to a substrate and a motor for driving the bonding device, the control device comprising: a motion control unit for controlling motion of the motor to control a motion trajectory of the bonding device; a touch detection unit being set to: receiving a plurality of rectifying commands relating to force or torque within the most recent sample period from the motion control unit; determining a mean value of the plurality of rectifying commands; obtaining the latest rectifying command after the most recent sample period; determining a difference between the mean value and the latest rectifying command; determining whether there is a touch between the component and the substrate substitute according to the difference; wherein the motion control unit being set to: updating the position-time command by the path planner when the touch detection unit determines that the touch occurs.

Preferably, if the difference is greater than a predetermined threshold, it is determined that the touch occurs.

Preferably, if signs for a preset of successive said difference values remain unchanged, then it is determined that the touch occurs.

Preferably, the updating of a position-time command makes the bonding device to move at a preset speed for a first predetermined period of time before and after the component and the substrate being touched.

Preferably, the updating of the position-time command makes the component to be continuously pressed to the substrate with a predetermined force for a second predetermined period of time.

Preferably, the motion control unit is further configured to: obtain a position of the bonding device at a specific time point by a position sensor and generate a position feedback signal; compare the position feedback signal to a position-time command generated by the path planner in the motion control unit; generate a corresponding rectifying command based on the result of the comparison to control the motion of the motor.

Preferably, the control device further comprises a motor driver, the motor driver being configured to: obtain the latest rectifying command of the motion control unit; obtain the latest phase current of the motor and generate a corresponding input feedback signal; compare the latest rectifying command with the input feedback signal; adjust the outputted phase current to the motor according to the result of the comparison.

According to the technical solution of the present invention, the use of the touch sensor in the prior arts can be omitted, thereby overcoming various defects in the prior arts due to the use of the touch sensor. In addition, the invention can effectively ensure or even improve the manufacturing quality of semiconductor components by using the touch detection module.

The above is a summary of the present application, and may be simplified, summarized, and partially omitted. It is to be understood by those skilled in the art that this part is only illustrative and not intended to limit the scope of the application. This summary is not intended to identify key features or essential features of the claimed subject matter, nor intended to be used as an aid in determining the scope of the claimed subject matter.

BRIEF DESCRIPTION OF DRAWINGS

The above and other features of the present invention will be fully understood through the following specification and claims combining with figures. It is to be understood that the figures do not limit the scope of the invention. The invention will be illustrated by the figures and become more clear.

DETAILED DESCRIPTION OF THE EMBODIMENTS

Specific embodiments of the present invention will be specifically described below with the figures. In the figures, similar symbols generally indicate similar components unless otherwise noted. The embodiments described in the detailed description, figures and claims are intended to be illustrative and not defining. Other embodiments may be utilized, and other changes may be made, without departing from the spirit or scope of the subject matter of the application. It will be understood that various configurations, substitutions, combinations and designs of various aspects of this application described in general in this article and illustrated in the figures can be made in various forms, all of which will form part of this application.

Figure 1:
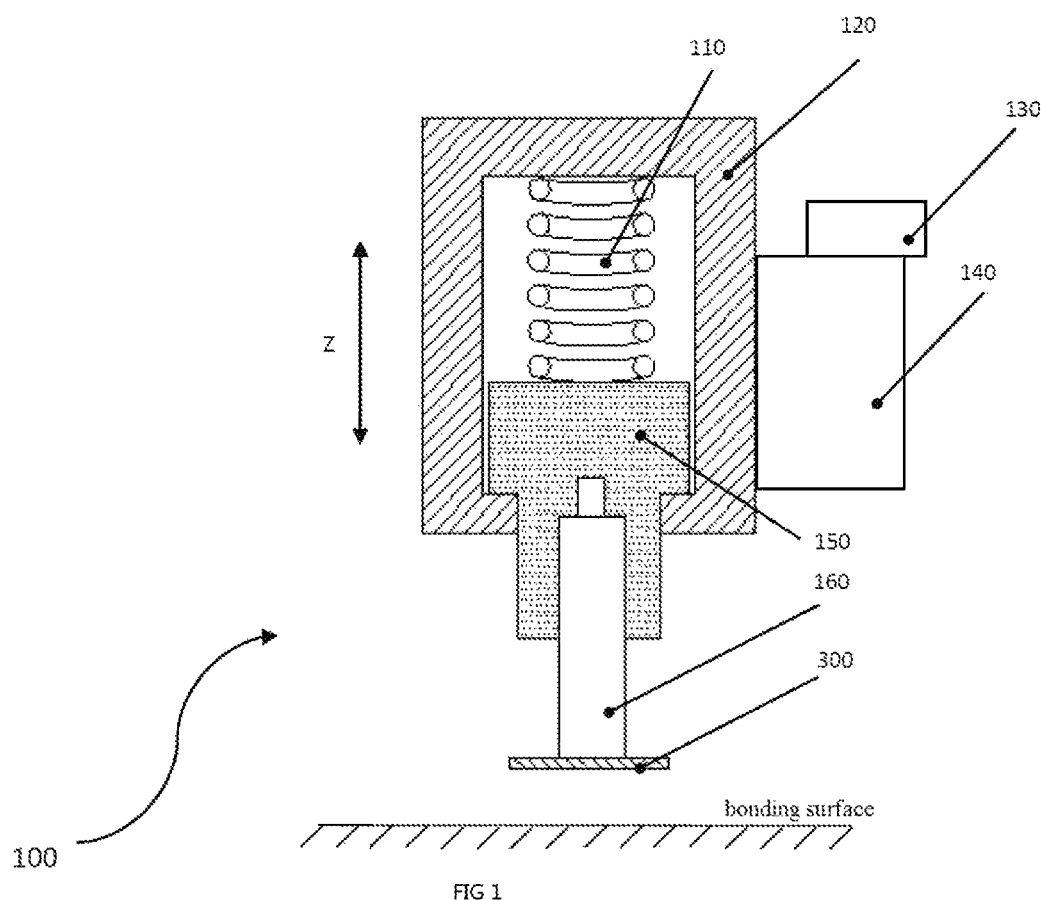
FIG. 1 is a schematic diagram of a bonding device of a semiconductor packaging apparatus according to the present invention.

FIG. 1 is a schematic diagram of a bonding device 100 of a semiconductor packaging apparatus. The bonding device 100 can also be used in a variety of other types of semiconductor manufacturing apparatus. For example, a semiconductor packaging apparatus suitable for use in connection with the present invention is patent application PCT/CN2016/071706 entitled "Apparatus and method for packaging components" filed by this applicant on Jan. 22, 2016, and patent application PCT/CN2016/076233 entitled "Chip packaging apparatus and method thereof", filed on Mar. 14, 2016. The contents of the two applications are hereby incorporated by reference in its entirety.

Referring to FIG. 1, the bonding device 100 comprises a substantially cylindrical housing 120 having a cavity therein for receiving a spring 110 and a slider 150. The size of the main body of the slider 150 is substantially identical to the size of the cavity of the housing 120 such that the slider 150 can smoothly slide along Z-axis within the cavity. The upper end of the slider 150 is in connection with the helical spring 110, and the other end is connected to a shaft 160. The slider 150 is connected to the shaft 160 through a mounting portion, which extends from the housing 120. The shaft 160 can be provided with a suitable mechanism (such as a suction cup) to pick up a component 300, such as a die. It can be understood that in the process of bonding the component 300 to the substrate (not shown), the component 300 picked up by the bonding device 100 will stop moving due to touching the substrate, but the housing 120 of the bonding device 100 will continue to move toward the substrate and to compress the spring 110 in the housing 120 such that the component and the substrate are bonded to each other by an adhesive under a certain pressure. The pressure can be adjusted and set by the spring 110. The inner cavity surface of the housing 120 is provided with a flange that abuts one end of the main body of the slider 150, to block the slider 150 from slipping out of the cavity. The housing of the bonding device 100 is further mounted with a motor 140 for driving the bonding device 100, and a position sensor 130 for detecting the position of the bonding device 100 at a specific time point, generating a position signal and sending the signal to a motion control unit 170 (see FIG. 3). The motion control unit 170 will form a closed loop control of the movement of the bonding device 100 according to the position signal (described in further detail below).

As described above, the shaft 160 of the bonding device 100 of FIG. 1 can be equipped with a component pick-up device (not shown), such as a vacuum suction cup. For example, when the mechanism is moved to a wafer, the bonding device 100, under the drive of the motor 140, will pick up the die 300 from the wafer through the suction cup. Then, when the mechanism moves to a dipping platform, the bonding device 100 is moved by the motor to the dipping platform to apply the die to the adhesive. Finally, as the mechanism moves over the bonding plane, the bonding device 100 is driven by the motor to the bonding plane shown in FIG. 1, ready to bond the die to the substrate on the bonding plane. In order to achieve the bonding, the bonding device 100 starts to accelerate toward the substrate located on the bonding plane from a predetermined position above the bonding plane. After reaching a preset speed, the bonding device 100 moves at a constant speed for a preset period of time, and then decelerates until stop, thereby completing the bonding of the die to the substrate. After completing the above bonding, the suction cup releases the die. It then returns according to the opposite motion trajectory, and moves to the picking platform to restart the bonding process for the next die.

Figure 2:
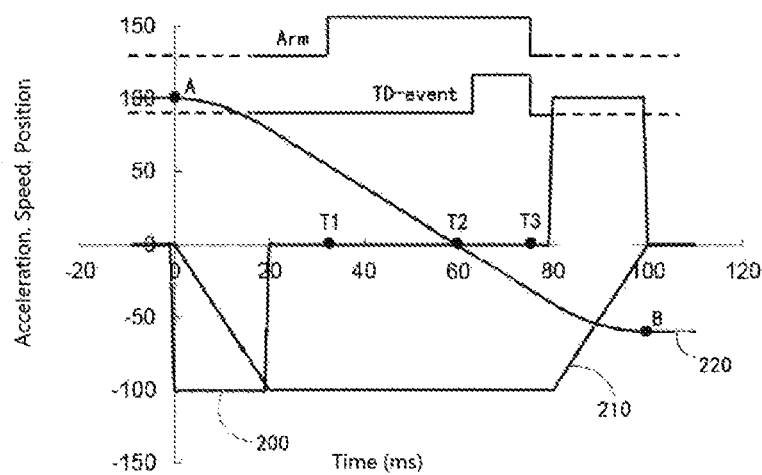
FIG. 2 is a motion trajectory diagram of the first half bonding process of a bonding device shown in FIG. 1 and shows a variation of speed, acceleration and position of the bonding device as time changes.

FIG. 2 is a motion trajectory diagram of the first half bonding process of the bonding device shown in FIG. 1 and also shows an acceleration curve 200, a speed curve 210, and a position curve 220 representing changes in acceleration, speed, and position of the bonding device, respectively. The horizontal axis in FIG. 2 represents time in milliseconds; the vertical axis is in micrometers, and the values on the vertical axis represent the bonding device 100's acceleration on the acceleration curve 200, speed on the speed curve 210 and position on the position curve 220.

Referring to the position curve 220 in FIG. 2, the position curve 220 represents the motion trajectory of the bonding device moving from position A (0, 100) to position B (100, −50) during a bonding process. The zero position (60, 0) of the position curve 220 corresponds to the position of the bonding device 100 when the picked die 100 touches the substrate on the bonding plane. In combination with the acceleration curve 200 and the speed curve 210, the entire bonding process of the bonding device 100 is: the housing 120 of the bonding device 100 is activated from position A and moves downward toward the bonding plane with an acceleration of 200 μm/ms; at about 20 ms, the housing 120 of the bonding device 100 reaches 100 μm/ms and keeps moving downward at this speed; at about 60 ms, the die on the bonding device 100 touches the substrate on the bonding plane; at about 80 ms, the housing of the bonding device 120 begins to move downward at a deceleration of 100 μm/ms until it stops at position B.

Figure 3:
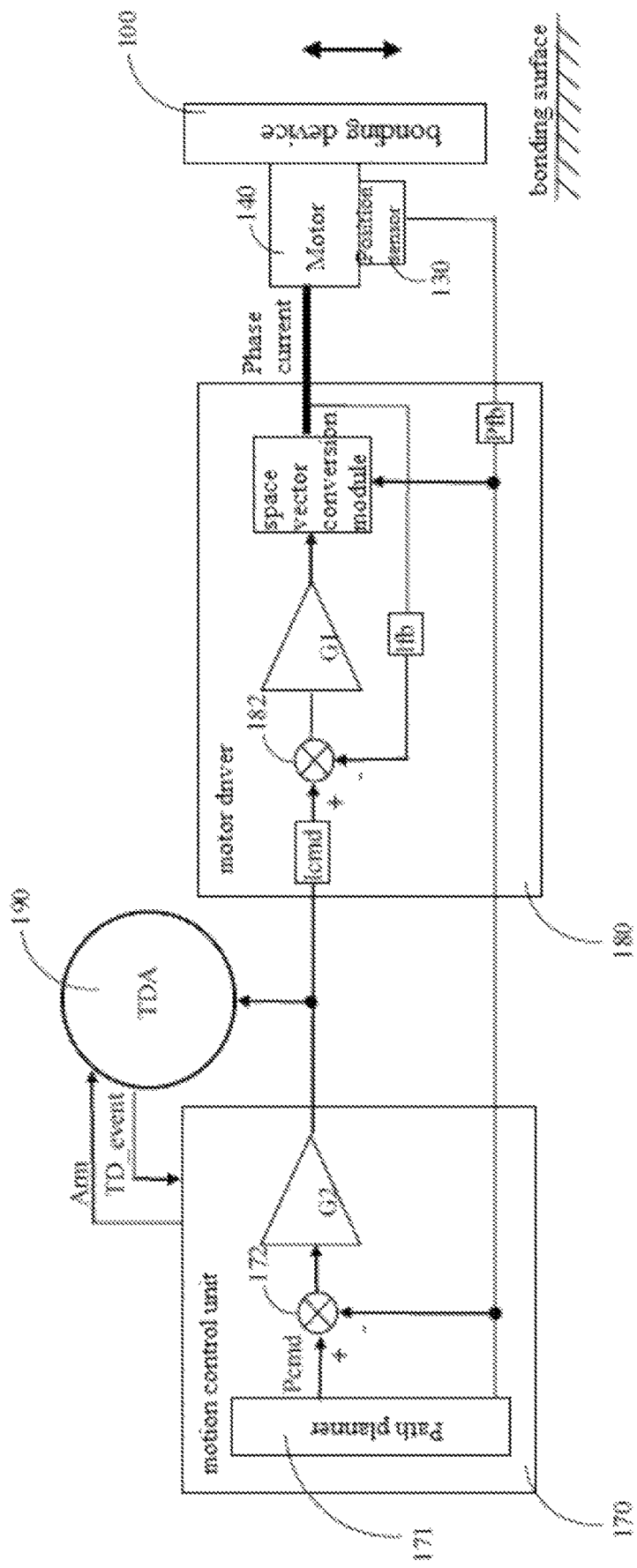
FIG. 3 is a schematic diagram of a control structure for a semiconductor packaging apparatus according to the present invention.

Referring to FIG. 3, it shows a schematic diagram of a control structure for a semiconductor packaging apparatus according to the present invention. It should be noted that, for brevity, most of the devices of the packaging apparatus are omitted, and only the bonding device 100 and its partial control components are shown. Although this specification is made by taking only the bonding device in the packaging apparatus as an example, those skilled in the art can understand that the present invention can be applied to various other semiconductor manufacturing apparatus or components after understanding the spirit and principle of the present invention.

In FIG. 3, the semiconductor packaging apparatus comprises the bonding device 100 for bonding a component to a substrate. The bonding device 100 is provided with a motor 140 for driving the bonding device 100, and a position sensor 130 for detecting the position of the bonding device 100 at a specific time point and generating a position signal. The motor 140 can be selected according to actual needs, such as a linear motor of type UF3 or UM6 produced by Dutch company Tecnotion, or a linear voice coil motor AVM3x/4x produced by Singapore company Akribis. The position sensor can also be selected according to actual needs, such as various suitable encoders. For example, a linear encoder manufactured by Micro-E/Renishaw/Heidenhain can be used to match the corresponding linear motor or voice coil motor.

The semiconductor packaging apparatus also comprises a motion control unit 170 for controlling the motion of the motor 140. The motion control unit comprises a path planner 171 that can generate a position-time command of the motion trajectory of the bonding device 100 at various time points in the bonding process. A MEI Synqnet controller can be selected as the motion control unit 170. The semiconductor packaging apparatus further comprises a motor driver 180 configured to receive a rectifying command sent from the motion control unit 170 and provide a corresponding phase current to the motor 140 according to the rectifying command, thereby driving the motor 140 to perform a corresponding motion. The motor driver 180 can be selected according to specific needs. For example, an iMx driving unit produced by Singapore Capcon Ltd can be selected.

As shown in FIG. 3, the semiconductor packaging apparatus may further comprise a touch detection algorithm TDA being configured to: after receiving the start signal "Arm" of the motion control unit 170, the TDA starts to continuously receive rectifying commands "Icmd" from the motion control unit 170 regarding the operation of the motor 140, and detects a touch event "TD-event" that occurs on the bonding device during the bonding process according to the received rectifying command "Icmd", and sends the touch event "TD-event" to the motion control unit. The motion control unit will update the next location-time command based on the touch event "TD-event", and/or change the control flow. The specific working principle and manner of the TDA will be specifically described and illustrated below in conjunction with FIG. 4.

During operation of the packaging apparatus shown in FIG. 3, the motion controller 170 compares the position-time command "Pcmd" generated by the path planner with the actual position "Pfb" fed back by the position sensor 130 to generate a rectifying command "Icmd". The "Icmd" is sent to the motor driver 180 and is compared with the actual phase current "Ifb" detected in the coil by the motor driver 180 to generate a phase current control command. The current control command is outputted to the motor through a space vector conversion module. The motor can drive the bonding device to perform a bonding process with a predetermined motion trajectory (including acceleration, speed, and position) under the action of the phase current.

In order to be able to accurately control the movement of the bonding device, a closed position feedback loop is provided in the control system. As shown in FIG. 3, the position sensor 130 on the bonding device obtains the position of the bonding device 100, and generates and sends a position feedback signal "Pfd" of the bonding device to the motion control unit 170. The motion control unit 170 compares the received position feedback signal "Pfd" with a preset position-time command through a comparator 172, and adjusts the rectifying command "Icmd" based on comparison. The adjustment of the rectifying command "Icmd" makes the phase current provided to the motor to be adjusted accordingly, thereby enabling the actual motion trajectory of the motor to be closest to the predetermined motion trajectory. In addition, the motor position feedback signal "Pfd" of the position sensor 130 may also be sent to a space vector converter to optimize the outputted phase current.

The control system shown in FIG. 3 is also provided with a gain control unit to further improve the running accuracy of the motor and the bonding device. As shown in FIG. 3, in the motor driver 180, the phase current outputted by the space vector conversion module is converted into an input feedback signal "Ifd". A comparator 182 in the motor driver 180 compares the input feedback signal with the rectifying command "Icmd" and adjusts the rectifying command "Icmd" based on the comparison. Thereafter, the space vector converter outputs a new phase current to the motor 140 based on the adjusted "Icmd", so that the motor 140 can drive the bonding device 100 to move closest to the predetermined motion trajectory.

The touch detection algorithm (TDA) 190 in FIG. 3 will be specifically described below with reference to FIG. 4. The touch detection algorithm 190 includes a memory module 191 and a calculation comparison module 192. The memory module 191 can obtain and store a plurality of rectifying commands $I_{N-w}$-$I_N$ during the most recent sample period. The number of rectifying commands depends on the duration of the sample period. The calculation comparison module 192 is configured to calculate an average of the plurality of rectifying commands $I_{N-w}$-$I_N$ and receive the latest rectifying command $I_N$ during the sample period. The average is then compared to the latest rectifying command. The TDA further includes a touch determination module 193, which is configured to determine whether there is a touch event (TD-event) based on the comparison. Wherein, if the difference value is greater than a preset threshold, it is determined that there is a touch; or, if signs for a preset number of successive said difference values remain unchanged, then it is determined that there is a touch. The term "signs of said difference values" means that the difference is positive or negative. In general, the former often occurs in the case of high-speed movement of the bonding device, while the latter often occurs in the case of low-speed movement of the bonding device. The touch determination module may be configured to determine a touch event only in a high-speed condition, or only in a low-speed condition, or in both conditions.

Figure 4:
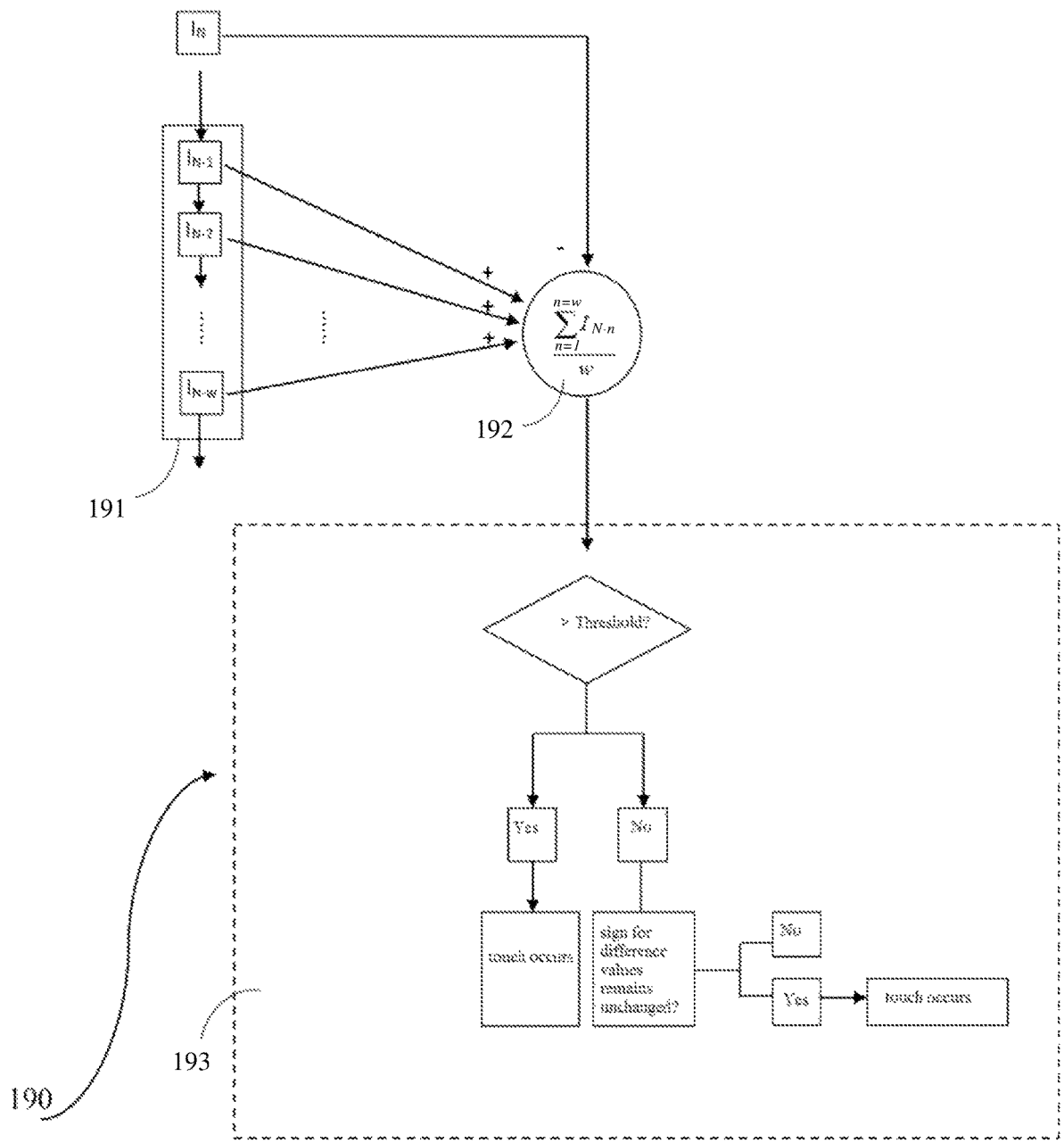
FIG. 4 is a schematic flow chart of the TDA (touch detection algorithm) in FIG. 3.

Referring to FIG. 4, at time N, by using the concept of sample memory, the following formula can be obtained:

$$I_{avg} = \left( \frac{\sum_{n=1}^{n=w} I_{N-n}}{w} \right)$$

$$T_N = I_N - I_{avg} > Th \ldots \text{Thereshold mode}$$

$$S_N = \text{Sign}(T_N), S_N = S_{N-1} = \ldots = S_{N-m+1} \ldots \text{Successive sign mode}$$

At time N, the latest rectifying command "Icmd" is $I_N$, and the latest sequence $I_{N-1}, I_{N-2}, \ldots, I_{N-w}$ of w rectifying commands have been stored in the sample memory. And the average of the sequence is $I_{avg}$. Therefore, $T_N$ can be calculated. When $T_N > T_h$, the threshold mode detects the occurrence of a touch event. This is generally applicable to a case where a preset average speed is relatively high before the touch. The sign $S_N$ of $T_N$ can also be determined. When there are successive m identical signs, it means that a successive sign mode detects the occurrence of a touch event. This is generally applicable to the case where the preset average speed is relatively low before the touch. Any one of the detection modes can be used to detect the occurrence of a touch event; or two modes can be used together. No matter which mode satisfies the criterion, a touch event is considered to occur.

Figure 5:
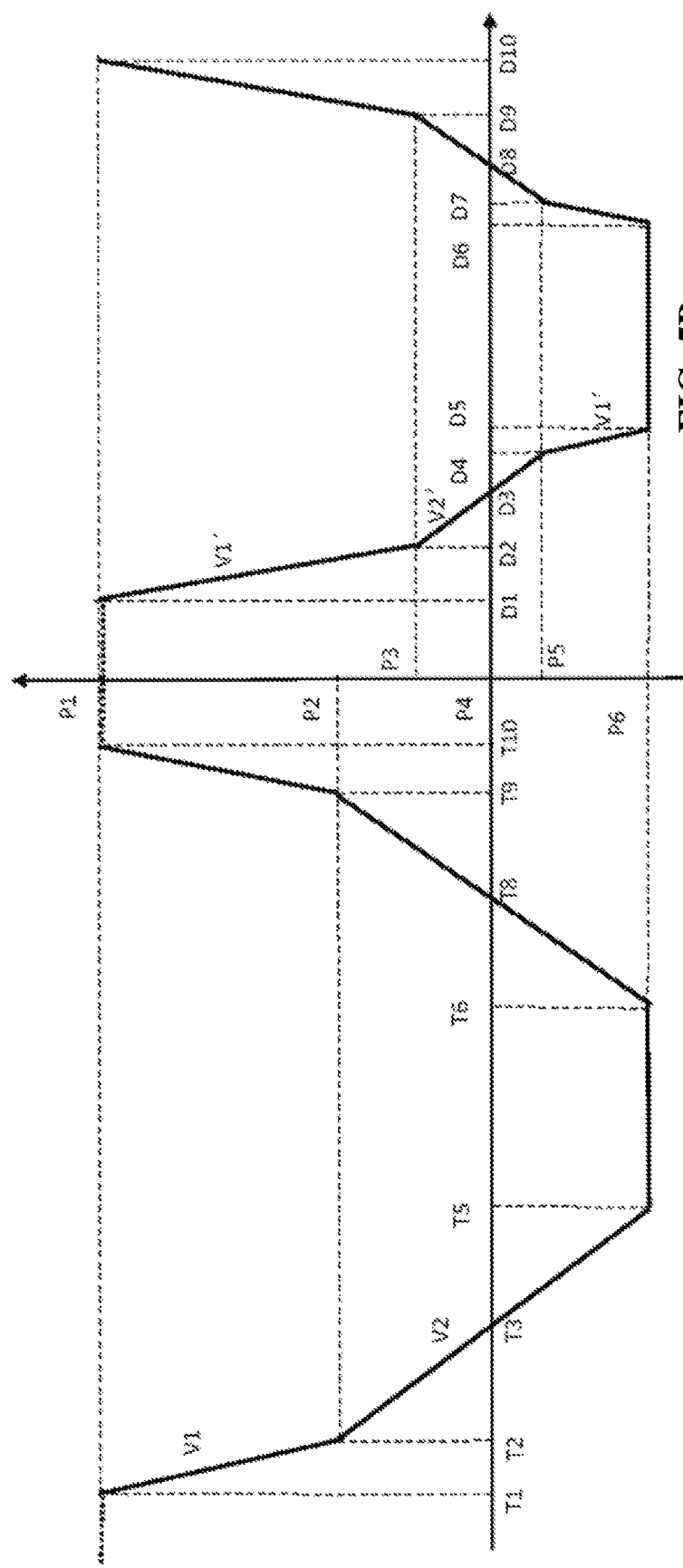
FIG. 5A is a motion trajectory diagram of a prior art bonding device obtained by an oscilloscope.
FIG. 5B is a schematic diagram of a motion trajectory of the bonding device with the TDA according to the present invention.

Referring to FIG. 5A and FIG. 5B, wherein FIG. 5A is a motion trajectory diagram of a prior art bonding device in a bonding process, whereas FIG. 5B is a motion trajectory diagram of a bonding device using the TDA in a bonding process of the present invention. By comparing the two, the beneficial effects of the present invention can be more clearly seen. It must be noted that the motion trajectory diagram is obtained by a digital oscilloscope and is only for illustrative purposes instead of being for limitation.

FIG. 5A shows a motion trajectory diagram of a prior art bonding device in a back and forth bonding process. The x-axis represents time and y-axis represents height of the housing of the bonding device. The height is zero when the component on the bonding device touches the bonding surface or the substrate on the bonding surface. It can be understood that the slope of the trace line in the figure represents the speed of the bonding device. As shown in FIG. 5A, at time T1, the bonding device starts moving toward the substrate from height P1 at speed V1. At time T2, the bonding device reaches height P2 and continues to move toward the substrate at speed V2 that is less than V1. At times T3, the component on the bonding device touches the substance (height P4, also called "zero point") and stops moving. However, the speed of the housing of the bonding device does not change and continues to move toward the substrate, and compresses the spring within the housing to apply a predetermined pressure to the substrate through the slider 150 and the shaft 160. At time T5, the bonding device reaches height P6 and stops moving until T6. Starting from T6, the bonding device returns in the reverse order of T1-T5 to pick up the next component for bonding.

Referring to FIG. 5B, in the bonding process of the present invention, at time D1, the bonding device starts moving toward the substrate from height P1 at speed V1. Normally, the difference of height between two adjacent bonding positions is close to zero. Since the exact height is already known by the touch detection method of the present invention when the previous touch occurs, at time D2, the bonding device can move to height P3 which is closer to the bonding device with the faster speed V1, and then continues to move toward the substrate at the safe speed V2 that is less than V1. At time D3, the component on the bonding device touches the substrate (height P4, also called "zero point") and stops moving. However, the housing of the bonding device continues to move toward the substrate and compresses the spring in the bonding device to apply a predetermined pressure to the substrate. At time D4, the housing of the bonding device is accelerated to V1', which is equal to V1, moving downward. At time D5, when the housing of the bonding device reaches height P6, it stops moving until D6. Starting from D6, the bonding device returns in the reverse order of D1-D5 to pick up the next component for bonding. Since the impact force is proportional to the speed at the touch, it is desirable that the speed before the touch event is as small as possible; on the other hand, in the entire bonding process, the total time is desired to be as short as possible. The present invention fully satisfies the demands of these two aspects, so that movements at high-speed V1 occur in most paths, such as paths P1-P3 and P5-P6 in FIG. 5B, which greatly save time; at the same time, movements at low speed V2 occur in a small path to reduce the touch impact, such as the path P3-P5 in FIG. 5B.

In order to complete the bonding, the bonding device needs to run from height P1 to P6 and then return from P6 to P1. This process can be seen as the bonding process. The duration of the bonding process directly affects the manufacturing efficiency for packaging components. As can be seen from FIG. 5, in the case where the touch detection is not used (FIG. 5A), it takes time T1-T10 for the bonding process. In the case where the touch detection according to the present invention is used (FIG. 5B), it takes time D1-D10, which is shorter than T1-T10, for the bonding process. It can be seen that the touch detection of the present invention can effectively reduce the process time, thereby greatly improving the bonding efficiency and the manufacturing efficiency. Reducing the bonding time is taking advantage of increasing the moving speed of the bonding device without decreasing the bonding quality.

In the bonding process shown in FIG. 5A and FIG. 5B, time T5-T6 and time D5-D6 are the time periods for a bond holding process, that is, the process which the component and the substrate are fixedly joined together by an adhesive. During the bond holding process, the bonding device stops moving and applies a predetermined bonding force to the component through the spring. The duration of the process directly affects the bonding quality. It can be understood that when other conditions are same, as the bond holding process being longer, the adhesive between the component and the substrate can be better cured, so that the bonding effect is better. As can be seen by comparing FIG. 5A and FIG. 5B, time T5-T6 and time D5-D6 are substantially same. That is to say, after using the touch detection according to the present invention, even if the duration of a single bonding process is reduced, the duration of bond holding process is not reduced, so that the manufacturing efficiency for packaging semiconductors can be effectively improved while ensuring the bonding quality.

Another determinant of component bonding quality is the speed of the component right before it touches the substrate, which can be called a touch speed. The component will have an impact when it touches the substrate. If the speed is too fast, the impact force will be too large. The excessive impact may damage the component and the substrate. Moreover, since the component is bonded to the substrate by adhesive, an excessive impact force will affect the distribution of the adhesive between the component and the substrate. Therefore, controlling the component to be at a suitable low speed right before touching the substrate is needed. In one embodiment of the present invention, the specific steps includes: detecting a touch location of the bonding device when a component touches a substrate; rectifying the next position-time command according to the touch position information, thereby adjusting the touch speed of the bonding device at the touch position and the touch duration of the bonding device running at the touch speed constantly, thereby rectifying the motion trajectory of the bonding device over the entire bonding process. As can be seen from FIG. 5A and FIG. 5B, the bonding device keeps same speed for a period of time before and after the component touches the substrate. That is, the bonding process shown in the figure using the touch detection according to the present invention has the same bonding quality as the bonding process in the prior art without the touch detection.

Figure 6:
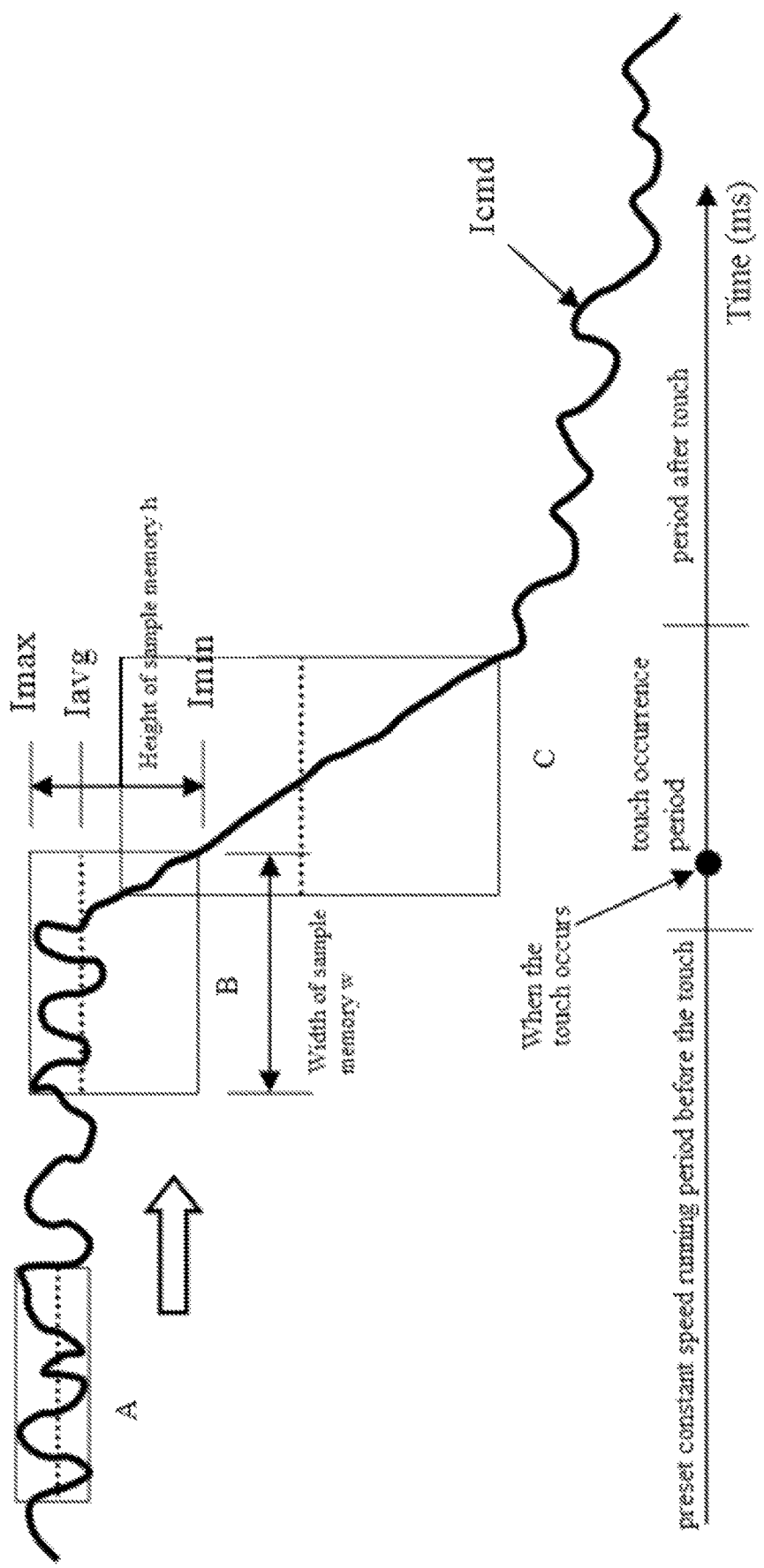
FIG. 6 shows an exemplary mathematical model for the touch detection algorithm of the present invention.

As a further illustration of the invention, FIG. 6 shows a mathematical model for the touch detection algorithm of the present invention. It should be noted that the mathematical model is for illustrative purposes only and is not intended to limit the invention in any way. During the full operation of the bonding device, the signal characteristics of the rectifying command are relatively complicated. However, for a predetermined known bonding action control process, the path planner can roughly estimate the time period during which a touch may occur. The path planner makes the bonding device move at a predetermined appropriate speed and activates a TDA (touch detection algorithm) to start the touch detection before detecting an exact time point and a touch position of the touch event according to the present invention. The signal of the rectifying command "Icmd" in the subsequent process has undergone "preset running time period at a constant speed before touch", "touch occurrence period", and "period after touch" as generally shown in FIG. 6.

In FIG. 6, the solid-line box represents the sample memory in the control system. The width w of the sample memory represents that there are w consecutive "Icmd" rectifying commands temporarily stored in the memory; the height h of the sample memory represents the difference between the maximum rectifying commands "Imax" and the minimum "Imin" in the current sample memory; the average of all w samples in the sample memory is "Iavg", represented by dashed line in the memory. During the entire touch detection process, the sample memory is slid from position A of FIG. 6 to position B, and then slid to position C. During the sliding process, w does not change, and h varies with changes in "Imax" and "Imin"; "Iavg" also changes with changes of the sample memory's w samples at a certain time. According to the present invention, the signal characteristics of the rectifying command "Icmd" at the moment when the touch event occurs can be easily and accurately extracted at a turning position of B as shown in FIG. 6, so that the path planner can optimize the bonding after the touch occurs to make the bonding safe and more efficient.

As shown in FIG. 6, hA, hB, hC represent the height of the sample memory at positions A, B and C, respectively, depending on the signal characteristics. Define the threshold Th to satisfy:

$$3 \times hA \le Th \le \frac{hC}{2};$$

where hA is a possible maximum height of the sample memory in a preset running time period at a constant speed before touch; hC is a possible maximum height of the sample memory during the touch occurrence period. The m successive identical signs satisfies:

$$\frac{w}{4} \le m \le \frac{w}{2};$$

where w is the amount of data that can be stored in the sample memory.

In one embodiment, the motion control has a sampling frequency of 2 KHz, that is, for every 0.5 ms, the motion control unit and the path planner can generate a new rectifying command. For a 9-bit rectifying command, 32×9 bit sample memory is used. When using 50-8 threshold, 8-12 successive signs, for a preset constant speed from 100 mm/s to 1 mm/s before touching, bonding devices can accurately detect touch events.

It should be noted that although several units of the electrical connection device of the embodiments of the present application are mentioned in the above detailed description, such division is merely exemplary and not mandatory. In fact, according to the embodiments of the present application, the features and functions of the two or more units described above may be embodied in one unit. On the contrary, the features and functions of one unit described above may be further divided into multiple units.

Those skilled in the art can understand and make other variations to the disclosed embodiments by studying the specification, disclosed contents, figures and claims. In the claims, "comprise(s)" does not exclude other elements or steps and singular noun do not exclude plural. In a practical application of the invention, one unit/part can perform the functions of a plurality of technical features cited in the claims. Any reference signs in the claims should not be construed as limiting the scope.

What is claimed is:

1. A semiconductor packaging apparatus comprising:
a bonding device for bonding a component to a substrate;
a motor for driving the bonding device to operate according to a predetermined motion trajectory;
a position sensor for detecting a position of the bonding device at a specific time point and generating a position signal;
a motion control unit comprising a path planner for generating a position-time command for the bonding device, the motion control unit being configured to enable the path planner to update the position-time command based on a touch information between the component and the substrate;
wherein the semiconductor packaging apparatus further comprises a touch detecting unit for detecting the touch information, the touch detecting unit being configured to:
obtain a plurality of rectifying commands within a last sample period from the motion control unit;
determine a mean value of the plurality of rectifying commands during the last recent sample period;
obtain a last rectifying command after the last sample period;
calculate a difference between the mean value and the last rectifying command;
determine whether there is a touch between the component and the substrate according to the difference.

2. The semiconductor packaging apparatus according to claim 1, wherein the motion control unit is further configured to:
obtain the position signal generated by the position sensor at the specific time point;
compare the position signal with the position-time command generated by the path planner;
produce a corresponding rectifying command relating to force or torque to control motion of the motor according to a result of the comparison.

3. The semiconductor packaging apparatus according to claim 2, wherein the semiconductor packaging apparatus further comprises a motor driver, the motor driver being configured to:
obtain the rectifying command;
obtain a present phase current of the motor and generate a corresponding feedback signal;
compare the rectifying command with the feedback signal, and adjust an input phase current to the motor according to a result of the comparison.

4. The semiconductor packaging apparatus according to claim 1, wherein the touch information comprises:
a time point when the component touches the substrate; and/or
a position where the component touches the substrate; and/or
a speed of the component before touching the substrate.

5. The semiconductor packaging apparatus according to claim 1, wherein the update of the position-time command moves the bonding device at a preset speed for a preset time period before and after the component and the substrate being touched.

6. The semiconductor packaging apparatus according to claim 1, wherein the updated position-time command enables the component to reach a preset pressing force in a shorter time than by the position-time command before being updated and continue to maintain a preset pressing time after the detecting of the touch information occurs.

7. The semiconductor packaging apparatus according to claim 1, wherein if the difference is greater than a preset threshold, it is determined that the touch occurs.

8. The semiconductor packaging apparatus according to claim 1, wherein if signs for a preset number of successive said difference values remain unchanged, then it is determined that the touch occurs.

* * * * *